US011451214B2

(12) United States Patent
Takeda et al.

(10) Patent No.: US 11,451,214 B2
(45) Date of Patent: Sep. 20, 2022

(54) CONTROL DEVICE AND ACTIVE FILTER APPARATUS

(71) Applicant: Mitsubishi Electric Corporation, Tokyo (JP)

(72) Inventors: Masatoshi Takeda, Tokyo (JP); Tomohiko Tatsumi, Tokyo (JP); Shinichi Ogusa, Tokyo (JP); Akihiro Matsuda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/291,678

(22) PCT Filed: Dec. 18, 2018

(86) PCT No.: PCT/JP2018/046615
§ 371 (c)(1),
(2) Date: May 6, 2021

(87) PCT Pub. No.: WO2020/129161
PCT Pub. Date: Jun. 25, 2020

(65) Prior Publication Data
US 2022/0006445 A1    Jan. 6, 2022

(51) Int. Cl.
H03H 11/04         (2006.01)
H02M 1/12          (2006.01)
(52) U.S. Cl.
CPC .............. H03H 11/04 (2013.01); H02M 1/12 (2013.01)
(58) Field of Classification Search
None
See application file for complete search history.

(56) References Cited

U.S. PATENT DOCUMENTS 6,075,350 A * 6/2000 Peng ............... H02J 3/1857
                                                    363/40
10,511,220 B2 * 12/2019 Kawashima .......... H02M 7/48
10,651,651 B2 * 5/2020 Kono ................. H02M 7/493

FOREIGN PATENT DOCUMENTS

JP    2002320329 A    10/2002

OTHER PUBLICATIONS

Extended European Search Report dated Nov. 26, 2021, issued in corresponding European Application No. 18943420.2. (9 pages).
(Continued)

Primary Examiner — Jeffery S Zweizig
(74) Attorney, Agent, or Firm — Buchanan Ingersoll & Rooney PC

(57) ABSTRACT

A control device for an active filter connected in parallel with a load at an installation point with respect to an AC power supply provided in a power system includes a harmonic voltage detector to detect an m-order harmonic voltage (m is an integer not less than two) included in a voltage of the installation point, a phase corrector to correct a phase of the detected m-order harmonic voltage in accordance with whether an m-order harmonic impedance when an AC power supply side is seen from the installation point is capacitive or inductive, a command value generator to generate a first compensation command value for compensating for the m-order harmonic voltage included in the voltage of the installation point based on the m-order harmonic voltage after the correction, and an output controller to control an output of the active filter based on a first compensation command value.

16 Claims, 9 Drawing Sheets

(56) References Cited

OTHER PUBLICATIONS

Tarkiainen et al. "Mitigating Grid Voltage Harmonics Using a Line Converter With Active Filtering Feature", Electrical Engineering, vol. 88, No. 2, Aug. 20, 2004, pp. 97-107, XP019325262.
International Search Report (PCT/ISA/210) with translation and Written Opinion (PCT/ISA/237) dated Feb. 26, 2019, by the Japan Patent Office as the International Searching Authority for International Application No. PCT/JP2018/046615.

* cited by examiner

CONTROL DEVICE AND ACTIVE FILTER APPARATUS

TECHNICAL FIELD

The present disclosure relates to a technique related to power active filters.

BACKGROUND ART

A power system is connected with a high number of electrical devices, such as loads of high-voltage consumers, and accordingly, a harmonic voltage distortion is caused in a system voltage due to a harmonic current generated from these electrical devices. Since a higher harmonic voltage may damage a phase advance capacitor, a rotary machine, and the like connected to the same system, it is necessary to limit the harmonic voltage below the allowable value.

An active filter apparatus for suppressing a harmonic voltage has been conventionally known. The active filter apparatus includes an inverter circuit, a capacitor that stores direct-current (DC) power, and a control circuit for controlling the inverter circuit. The active filter apparatus generates a harmonic for cancelling out a harmonic of a distribution line and outputs the generated harmonic to the distribution line.

For example, Japanese Patent Laying-Open No. 2002-320329 (PTL 1) discloses an active filter apparatus for distribution system installed at a desired node of a distribution line. This apparatus detects a voltage of an installation point at sampling cycles, detects a harmonic voltage, amplifies a gain suitable for the harmonic voltage through automated adjustment, and then, provides a compensating current command value to the node per sampling cycle.

CITATION LIST

Patent Literature

PTL 1: Japanese Patent Laying-Open No. 2002-320329

SUMMARY OF INVENTION

Technical Problem

The active filter apparatus is intended for compensating for a harmonic generated by a load provided in the power system, and accordingly, has to detect a harmonic voltage included in a system voltage and control an output. However, the impedance of the power system is not constant, and as system conditions are changed, a system impedance may change from an inductive state to a capacitive state or from the inductive state to the capacitive state. Thus, although the harmonic can be suppressed when an impedance is inductive, for example, the harmonic may develop when the impedance is capacitive, resulting in complicated control.

The technique according to PTL 1 discusses suppressing a phenomenon of harmonic development in a distribution system and removing the harmonic, but does not disclose or teach a technique for solving the above problem.

An object in an aspect of the present disclosure is to provide a control device for an active filter and an active filter apparatus that are able to appropriately reduce a harmonic regardless of impedance characteristics of a power system.

Solution to Problem

According to an embodiment, a control device for an active filter is provided, where the active filter is connected in parallel with a load at an installation point with respect to an alternating-current (AC) power supply provided in a power system. The control device includes a harmonic voltage detector to detect an m-order harmonic voltage (m is an integer not less than two) included in a voltage of the installation point, a phase corrector to correct a phase of the detected m-order harmonic voltage in accordance with whether an m-order harmonic impedance when an AC power supply side is seen from the installation point is capacitive or inductive, a command value generator to generate a first compensation command value for compensating for the m-order harmonic voltage included in the voltage of the installation point based on the m-order harmonic voltage after the correction, and an output controller to control an output of the active filter based on the first compensation command value.

An active filter apparatus according to another embodiment includes an active filter connected in parallel with a load at an installation point with respect to an AC power supply provided in a power system, and a control device for the active filter. The control device includes a harmonic voltage detector to detect an m-order harmonic voltage (m is an integer not less than two) included in a voltage of the installation point, a phase corrector to correct a phase of the detected m-order harmonic voltage in accordance with whether an m-order harmonic impedance when an AC power supply side is seen from the installation point is capacitive or inductive, a command value generator to generate a first compensation command value for compensating for the m-order harmonic voltage included in the voltage of the installation point based on the m-order harmonic voltage after the correction, and an output controller to control an output of the active filter based on the first compensation command value.

Advantageous Effects of Invention

With the present disclosure, a harmonic can be reduced appropriately regardless of impedance characteristics of a power system.

DESCRIPTION OF EMBODIMENTS

Figure 1:
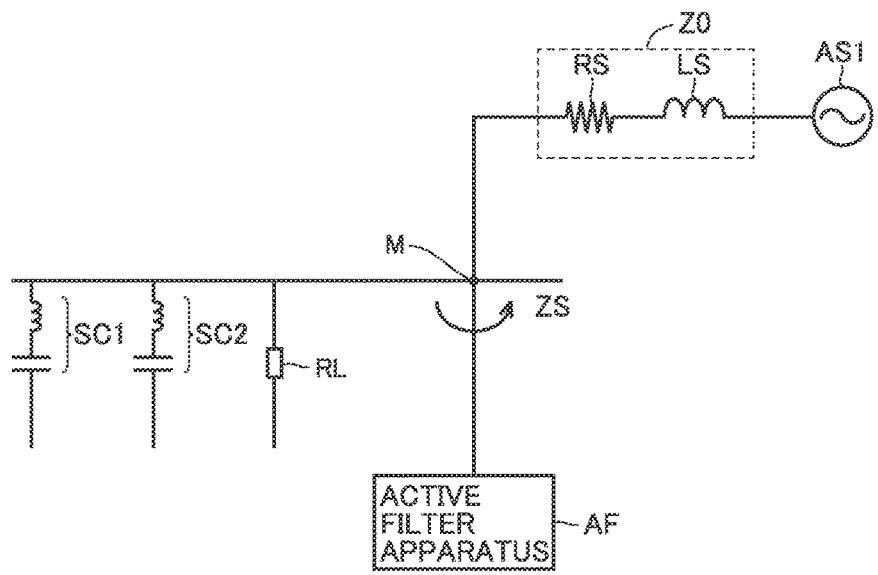
FIG. 1 is a diagram for illustrating a related technique and a problem thereof.

Embodiments of the present invention will be described below with reference to the drawings. In the description below, identical parts will be designated by the same reference numerals. Since their names and functions are also the same, the detailed description thereof will not be repeated.

[Related Technique and Problem Thereof]

A related technique and a problem thereof will be described for understanding of the present embodiment.

FIG. 1 is a diagram for illustrating a related technique and a problem thereof. Referring to FIG. 1, a power system includes a three-phase AC voltage supply AS1, a power line impedance Z0, a load RL, and phase advance capacitors SC1, SC2. Active filter apparatus AF is connected to the power system at an installation point M. Specifically, an inverter circuit of active filter apparatus AF is connected to installation point M via an interconnection reactor and a transformer.

Phase advance capacitor SC1 is a fixed phase advance capacitor always connected to the power system. Phase advance capacitor SC2 is a phase advance capacitor that can be connected to the power system or disconnected from the power system. Specifically, phase advance capacitor SC2 is connected to the power system or disconnected from the power system in accordance with the state of the system voltage and in response to opening/closing of a switch.

Assuming that ZS represents a system impedance when three-phase AC voltage AS1 is seen from installation point M of active filter apparatus AF, system impedance ZS exhibits characteristics as shown in FIG. 2 in response to connection or disconnection of phase advance capacitor SC2.

Figure 2A:
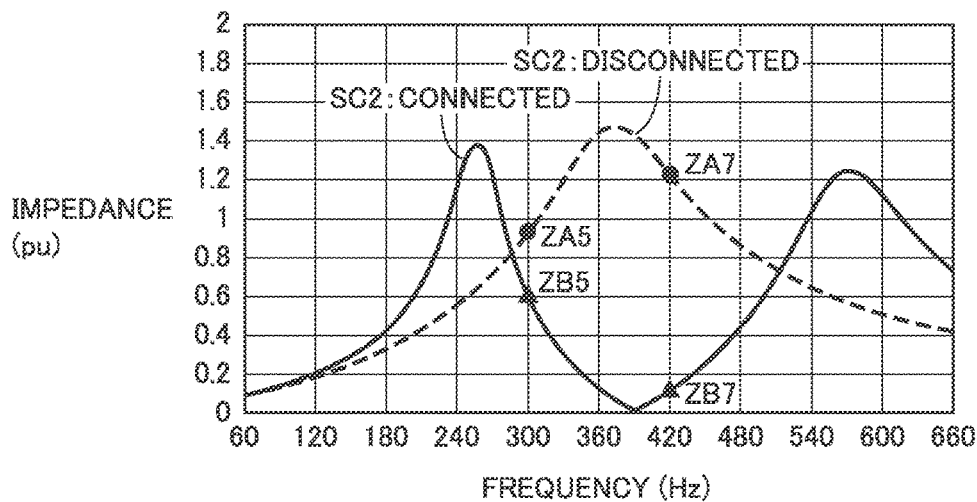
FIGS. 2(a) and 2(b) are diagrams for illustrating characteristics of a system impedance.
Figure 2B:
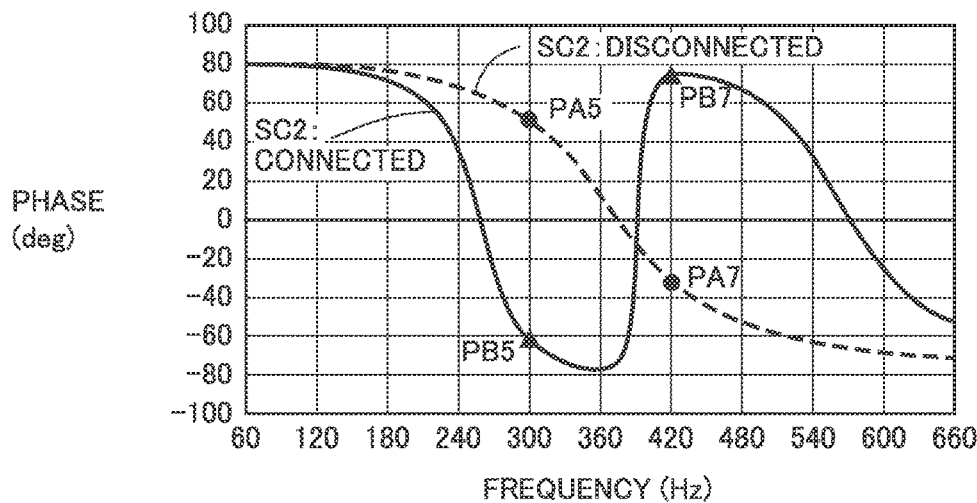

FIG. 2 is a diagram for illustrating the characteristics of the system impedance. Specifically, FIG. 2(a) shows a relation between an absolute value of system impedance ZS and a frequency. FIG. 2(b) shows a relation between a phase of system impedance ZS and a frequency.

Referring to FIGS. 2(a) and 2(b), when phase advance capacitor SC2 is disconnected, an absolute value and a phase of a system impedance of a fifth-order harmonic are represented by ZA5 and PA5, respectively. Since the polarity of phase PA5 is positive, the system impedance of the fifth-order harmonic is inductive. When phase advance capacitor SC2 is disconnected, an absolute value and a phase of a system impedance of a seventh-order harmonic are represented by ZA7 and PA7, respectively. Since the polarity of phase PA7 is negative, the system impedance of the seventh-order harmonic is capacitive.

In contrast, when phase advance capacitor SC2 is connected, the absolute value and the phase of the system impedance of the fifth-order harmonic are represented by ZB5 and PB5, respectively. Since the polarity of phase PB5 is negative, the system impedance of the fifth-order harmonic is capacitive. When phase advance capacitor SC2 is connected, the absolute value and the phase of the impedance of the seventh-order harmonic are represented by ZB7 and PB7, respectively. Since the polarity of phase PB7 is positive, the system impedance of the seventh-order harmonic is inductive.

The impedance of the power system changes in the direction from an inductive state to a capacitive state or in the opposite direction in accordance with the system conditions, such as connection or disconnection of a phase advance capacitor, as described above. Even when the impedance of a certain-order (e.g., fifth-order) is capacitive, the impedance of another-order (e.g., seventh-order) harmonic may be inductive. The active filter apparatus according to the related technique thus may fail to suppress a harmonic appropriately depending on the impedance characteristics.

In view of the above problem of the related technique, a specific configuration and a specific operation of an active filter apparatus according to the present embodiment will be described below.

Embodiment 1

<Overall Configuration>

Figure 3:
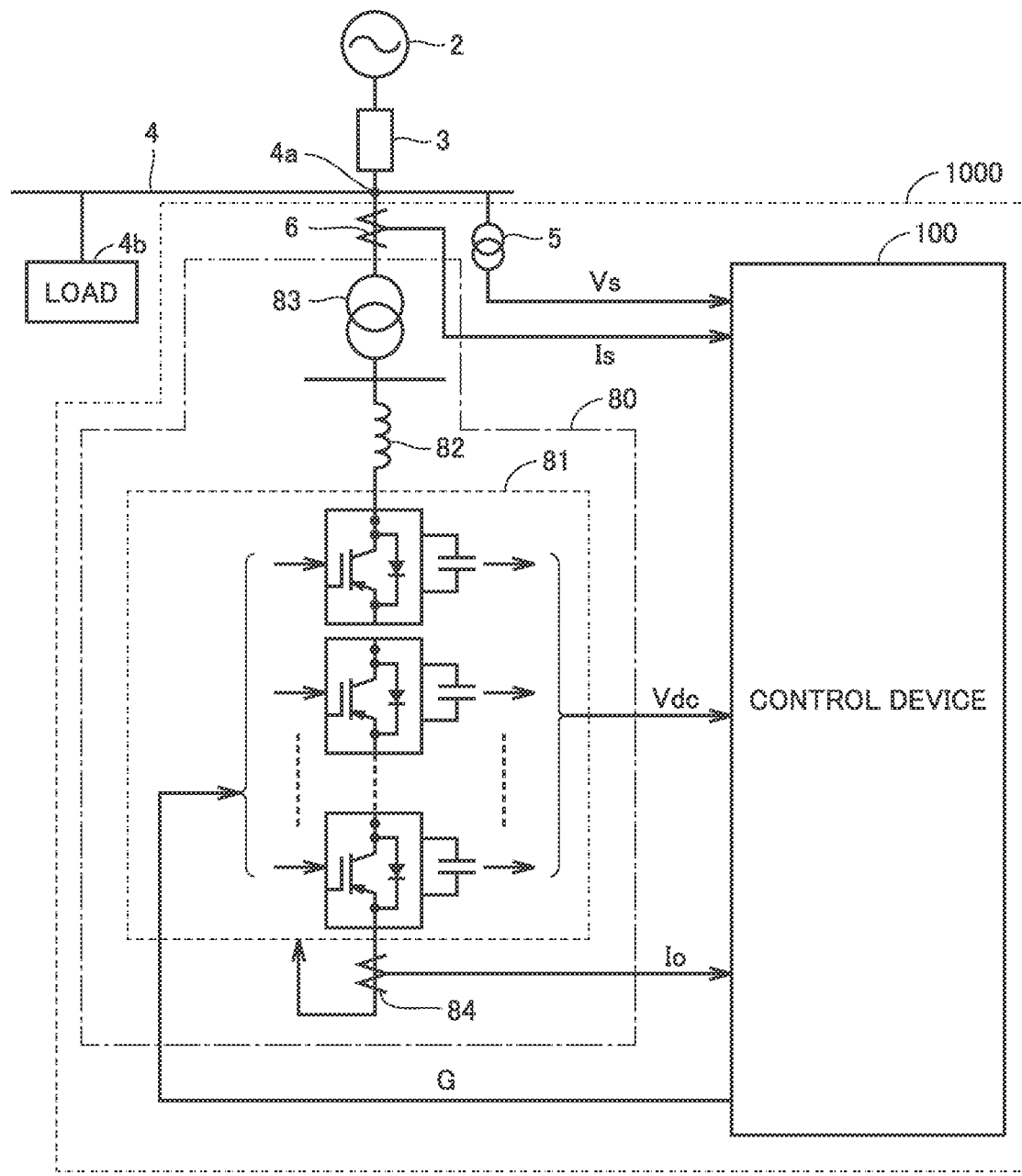
FIG. 3 shows a schematic configuration of an active filter apparatus according to Embodiment 1.

FIG. 3 shows a schematic configuration of an active filter apparatus according to Embodiment 1. In a power system shown in FIG. 3, a bus 4 supplies a load 4b, which generates a harmonic, with electric power from an AC power supply 2 via a system impedance 3.

A connection point between the power system and an active filter apparatus 1000 is recognized as an installation point 4a at which active filter apparatus 1000 is installed. In other words, bus 4 is connected with active filter apparatus 1000 at installation point 4a. AC power supply 2 is typically an AC power supply of three phases consisting of a-phase, b-phase, and c-phase.

Active filter apparatus 1000 includes a voltage transformer 5, a current transformer 6, an active filter 80, and a control device 100. Voltage transformer 5 detects a voltage Vs of installation point 4a and inputs voltage Vs to control device 100. Voltage Vs includes three-phase AC voltages (Va, Vb, Vc). Current transformer 6 detects a current Is output from active filter 80 to installation point 4a and inputs current Is to control device 100. Current Is includes three-phase AC currents (Ia, Ib, Ic).

Active filter 80 serves to suppress a harmonic in an installation point voltage and stabilize a voltage thereof. Active filter 80 is connected in parallel with a load 4b at installation point 4a with respect to AC power supply 2 provided in the power system. Specifically, active filter 80 includes a self-excited converter 81, an interconnection reactor 82, a transformer 83, and a current transformer 84. Current transformer 84 is typically a DC transformer capable of detecting a current value together with a DC component.

Self-excited converter 81 is connected via booster transformer 83 and interconnection reactor 82 which are connected to the bus 4 side. Interconnection reactor 82 has one end connected to a primary side of transformer 83 and the other end connected to self-excited converter 81.

Self-excited converter 81 is configured with a self-excited power converter. For example, self-excited converter 81 is configured with a modular multilevel converter (MMC). Note that the circuit system of self-excited converter 81 may be configured with a two-level converter that converts AC power into two levels of DC power or a three-level converter that converts AC power into three levels of DC power.

Self-excited converter 81 has a switching element and a DC capacitor connected in series. The switching element is, for example, an insulated gate bipolar transistor (IGBT) or a gate commutated turn-off thyristor (GCT). A DC voltage Vdc across the capacitor and an output current Io of self-excited converter 81, which is detected by current transformer 84, are supplied to control device 100. A gate pulse signal G of each phase (e.g., a-phase, b-phase, c-phase)

supplied from control device 100 is supplied to its corresponding switching element. Gate pulse signal G has been subjected to PWM modulation.

Self-excited converter 81 generates a harmonic compensating voltage of a polarity opposite to the polarity of the harmonic component of the power system, and this harmonic compensating voltage is output to installation point 4a and cancels out the harmonic component of the power system, thereby suppressing a harmonic. Self-excited converter 81 also generates fundamental wave reactive power that acts to suppress voltage fluctuations at installation point 4a, thus exhibiting a function of stabilizing a voltage of the power system.

<Configuration of Control Device>
(Hardware Configuration)

Figure 4:
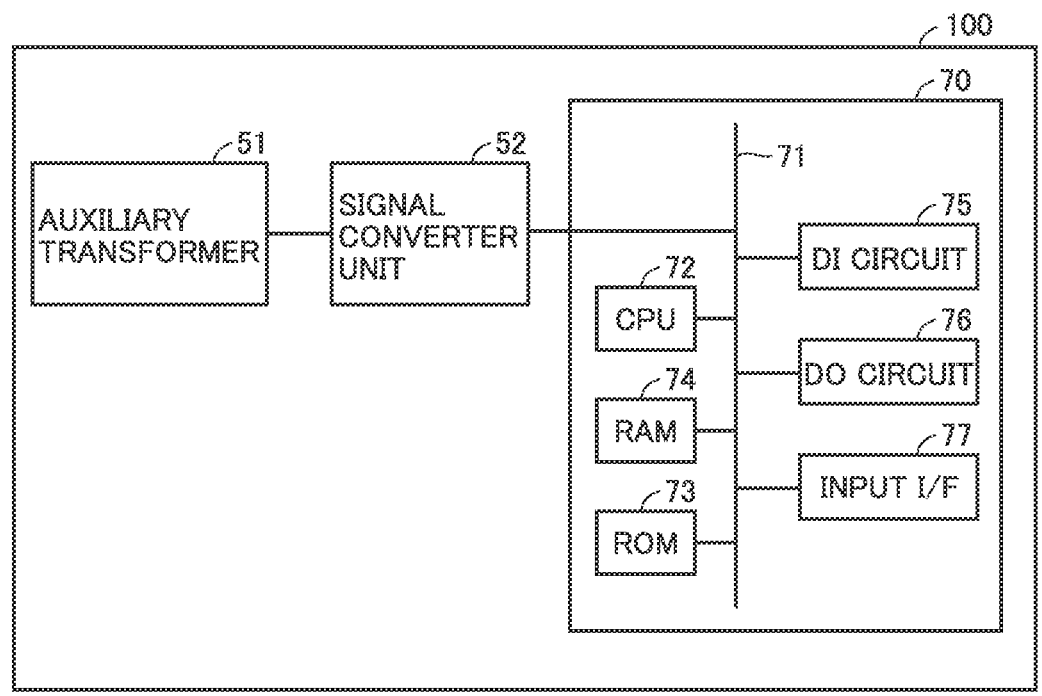
FIG. 4 shows an example hardware configuration of a control device according to Embodiment 1.

FIG. 4 shows an example hardware configuration of control device 100 according to Embodiment 1. Referring to FIG. 4, control device 100 includes an auxiliary transformer 51, a signal converter unit 52, and an arithmetic processing unit 70. Control device 100 is configured as a digital protection control device.

Auxiliary transformer 51 captures a voltage input from voltage transformer 5 and currents input from current transformers 6, 84, converts the voltage and currents into voltage signals suitable for signal processing in an internal circuit, and then outputs the voltage signals. Signal converter unit 52 captures an analog signal (i.e., voltage signal) output from auxiliary transformer 51 and converts the analog signal into a digital signal. Specifically, signal converter unit 52 includes an analog filter, a sample-and-hold circuit, a multiplexer, and an AD converter.

The analog filter removes a high-frequency noise component from the voltage signal output from auxiliary transformer 51. The sample-and-hold circuit samples signals output from the analog filter at predetermined sampling cycles. The multiplexer sequentially switches waveform signals input from the sample-and-hold circuit in chronological order based on timing signals input from arithmetic processing unit 70 and outputs the waveform signals to the AD converter. The AD converter converts the waveform signal input from the multiplexer from analog data into digital data. The AD converter outputs the digitally converted signal (i.e., digital data) to arithmetic processing unit 70.

Arithmetic processing unit 70 includes a central processing unit (CPU) 72, a ROM 73, a RAM 74, a digital input (DI) circuit 75, a digital output (DO) circuit 76, and an input interface (I/F) 77. These are coupled by a bus 71.

CPU 72 reads and executes programs pre-stored in ROM 73, thereby controlling the operation of control device 100. Note that ROM 73 stores various pieces of information used by CPU 72. CPU 72 is, for example, a microprocessor. Note that the hardware may be a field programmable gate array (FPGA), an application specific integrated circuit (ASIC), and any other circuit that has arithmetic functions, other than a CPU.

CPU 72 captures digital data from signal converter unit 52 via bus 71. CPU 72 performs a control operation using the captured digital data, based on a program stored in ROM 73.

CPU 72 externally outputs a control command via DO circuit 76 based on a result of the control operation. CPU 72 also receives a response to the control command via DI circuit 75. Input interface 77 typically includes various buttons or the like, and receives various setting operations from a system operator.

(Functional Configuration)

Figure 5:
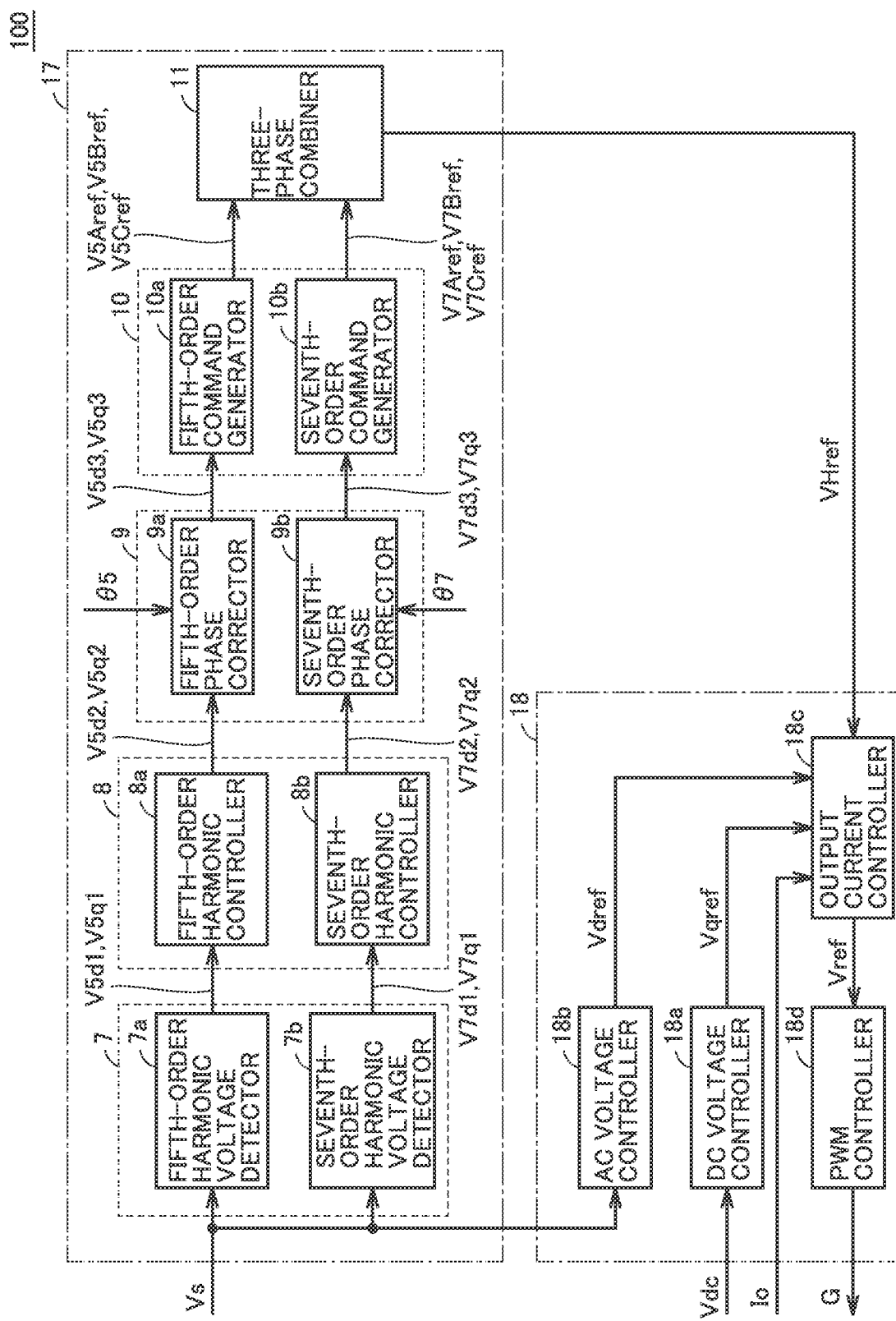
FIG. 5 is a schematic diagram showing a functional configuration of the control device according to Embodiment 1.

FIG. 5 is a schematic diagram showing a functional configuration of control device 100 according to Embodiment 1. Referring to FIG. 5, control device 100 includes a harmonic compensator 17 and an output controller 18. These functions are typically implemented by CPU 72 of arithmetic processing unit 70 executing the program stored in ROM 73. Note that some or all of these functions may be configured to be implemented with the use of a dedicated circuit.

Harmonic compensator 17 generates a compensation command value for compensating a harmonic of an order to be compensated for. The present embodiment will provide a description assuming that the harmonics of the orders to be compensated for are a fifth-order harmonic and a seventh-order harmonic. Harmonic compensator 17 includes a harmonic voltage detector 7, a harmonic controller 8, a phase corrector 9, a command generator 10, and a three-phase combiner 11.

Harmonic voltage detector 7 selectively detects only harmonic voltage components of the orders to be compensated for from voltage Vs detected by voltage transformer 5. Specifically, harmonic voltage detector 7 includes a fifth-order harmonic voltage detector 7a, which detects a fifth-order harmonic voltage included in voltage Vs, and a seventh-order harmonic voltage detector 7b, which detects a seventh-order harmonic voltage included in voltage Vs.

Fifth-order harmonic voltage detector 7a detects the three-phase fifth-order harmonic voltage component as a d-axis voltage value and a q-axis voltage value, on the rotation axis coordinates synchronized with the fifth-order harmonic frequency. Specifically, fifth-order harmonic voltage detector 7a detects the fifth-order harmonic voltages ($V5d1$, $V5q1$) from the three-phase AC voltages (Va, Vb, Vc) using Equations (1) and (2) below. In the description below, the fifth-order harmonic voltages ($V5d1$, $V5q1$) are also referred to as "fifth-order harmonic voltage detection values".

First, fifth-order harmonic voltage detector 7a converts the three-phase AC voltages into αβ components (Vα, Vβ) using a conversion equation expressed by Equation (1).

[Math 1]

$$\begin{bmatrix} V\alpha \\ V\beta \end{bmatrix} = \frac{2}{3} \begin{bmatrix} 1 & -1/2 & -1/2 \\ 0 & \sqrt{3}/2 & -\sqrt{3}/2 \end{bmatrix} \begin{bmatrix} Va \\ Vb \\ Vc \end{bmatrix} \quad (1)$$

Fifth-order harmonic voltage detector 7a then converts the αβ components (Vα, Vβ) into dq components ($V5d1$, $V5q1$) of the fifth-order harmonic using a conversion equation expressed by Equation (2).

[Math 2]

$$\begin{bmatrix} V5d1 \\ V5q1 \end{bmatrix} = \begin{bmatrix} \cos(5\omega t) & \sin(5\omega t) \\ -\sin(5\omega t) & \cos(5\omega t) \end{bmatrix} \begin{bmatrix} V\alpha \\ -V\beta \end{bmatrix} \quad (2)$$

Herein, ω is a fundamental angular frequency of a power supply voltage. Note that the fifth-order harmonic voltage, the phase sequence of three phases of which is in negative phase, is represented as −Vβ.

Seventh-order harmonic voltage detector 7b detects three-phase seventh-order harmonic voltage components as d-q-axis components on the rotation axis coordinates synchronized with the seventh-order harmonic frequency. Specifically, seventh-order harmonic voltage detector 7b detects seventh-order harmonic voltages (V7d1, V7q1) from the three-phase AC voltages (Va, Vb, Vc) using Equation (1) above and Equation (3) below. In the description below, the seventh-order harmonic voltages (V7d1, V7q1) are also referred to as "seventh-order harmonic voltage detection values".

[Math 3]

$$\begin{bmatrix} V7d1 \\ V7q1 \end{bmatrix} = \begin{bmatrix} \cos(7\omega t) & \sin(7\omega t) \\ -\sin(7\omega t) & \cos(7\omega t) \end{bmatrix} \begin{bmatrix} V\alpha \\ V\beta \end{bmatrix} \quad (3)$$

Herein, ω is a fundamental angular frequency of a power supply voltage. Note that the seventh-order harmonic voltage, the phase sequence of three phases of which is in positive phase, is represented as Vβ.

Harmonic controller 8 amplifies the harmonic voltage components detected by harmonic voltage detector 7 at a predetermined gain. Specifically, harmonic controller 8 includes a fifth-order harmonic controller 8a, which amplifies the detected fifth-order harmonic voltage at a gain constant K5, and a seventh-order harmonic controller 8b, which amplifies the detected seventh-order harmonic voltage at a gain constant K7.

Specifically, fifth-order harmonic controller 8a outputs, as vector components of fifth-order d-q-axis components, fifth-order harmonic voltages (V5d2, V5q2) obtained by multiplying the fifth-order harmonic voltage detection values (V5d1, V5q1) by the gain constant (i.e., K5) using Equation (4) below. In the description below, the fifth-order harmonic voltages (V5d2, V5q2) are also referred to as "fifth-order harmonic voltage signals". Seventh-order harmonic controller 8b outputs, as vector components of seventh-order d-q-axis vector components, seventh-order harmonic voltages (V7d2, V7q2) obtained by multiplying the seventh-order harmonic voltage detection values (V7d1, V7q1) by the gain constant (i.e., K7) using Equation (5) below. In the description below, the seventh-order harmonic voltages (V7d2, V7q2) are also referred to as "seventh-order harmonic voltage signals". Note that gain constants K5, K7 are appropriately determined by a system operator.

[Math 4]

$$\begin{bmatrix} V5d2 \\ V5q2 \end{bmatrix} = K5 \begin{bmatrix} V5d1 \\ V5q1 \end{bmatrix} \quad (4)$$

$$\begin{bmatrix} V7d2 \\ V7q2 \end{bmatrix} = K7 \begin{bmatrix} V7d1 \\ V7q1 \end{bmatrix} \quad (5)$$

Phase corrector 9 corrects phases of the d-q-axis vector components of the harmonic voltage signal in accordance with the characteristics of the system impedance (i.e., whether the system impedance is capacitive or inductive) when the AC power supply 2 side is seen from installation point 4a. For simplicity's sake, it is merely referred to as "correcting the phase(s) of the harmonic voltage signal(s)" in the description below. Specifically, phase corrector 9 includes a fifth-order phase corrector 9a and a seventh-order phase corrector 9b.

Fifth-order phase corrector 9a outputs fifth-order harmonic voltages (V5d3, V5q3) obtained by correcting the phases of fifth-order harmonic voltage signals (V5d2, V5q2) by an angle θ5 in accordance with whether the system impedance of the fifth-order harmonic is capacitive or inductive, using Equation (6) below. In the description below, the fifth-order harmonic voltages (V5d3, V5q3) are also referred to as "fifth-order harmonic signals after the correction", and angle θ5 is also referred to as "phase correction angle θ5". Seventh-order phase corrector 9b outputs seventh-order harmonic voltages (V7d3, V7q3) obtained by correcting the phases of the seventh-order harmonic voltage signals (V7d2, V7q2) by an angle θ7 in accordance with whether the system impedance of the seventh-order harmonic is capacitive or inductive, using Equation (7) below. In the description below, the seventh-order harmonic voltages (V7d3, V7q3) are also referred to as "seventh-order harmonic signals after the correction", and angle θ7 is also referred to as "phase correction angle θ7". Note that the method of correcting the phase of phase corrector 9 will be described below in detail.

[Math 5]

$$\begin{bmatrix} V5d3 \\ V5q3 \end{bmatrix} = \begin{bmatrix} \cos\theta5 & \sin\theta5 \\ -\sin\theta5 & \cos\theta5 \end{bmatrix} \begin{bmatrix} V5d2 \\ V5q2 \end{bmatrix} \quad (6)$$

$$\begin{bmatrix} y7d3 \\ y7q3 \end{bmatrix} = \begin{bmatrix} \cos\theta7 & \sin\theta7 \\ -\sin\theta7 & \cos\theta7 \end{bmatrix} \begin{bmatrix} V7d2 \\ V7q2 \end{bmatrix} \quad (7)$$

Command generator 10 generates a compensation command value for compensating for a harmonic voltage included in voltage Vs, based on the harmonic signal after the correction which has been subjected to phase correction. Specifically, command generator 10 includes a fifth-order command generator 10a and a seventh-order command generator 10b.

Fifth-order command generator 10a generates a compensation command value V5ref for compensating for the fifth-order harmonic voltages included in voltage Vs based on the fifth-order harmonic signals after the correction (V5d3, V5q3) subjected to phase correction, using Equation (8) below. Herein, Equation (8) reflects that the phase sequence of three phases of the fifth-order harmonic voltages is in negative phase. Assuming that the compensation command values of the fifth-order harmonic voltages of a-phase, b-phase, and c-phase are V5Aref, V5Bref, and V5Cref, respectively, V5ref=(V5Aref, V5Bref, V5Cref).

[Math 6]

$$\begin{bmatrix} V5Aref \\ V5Bref \\ V5Cref \end{bmatrix} = \begin{bmatrix} 1 & 0 \\ -1/2 & -\sqrt{3}/2 \\ -1/2 & \sqrt{3}/2 \end{bmatrix} \begin{bmatrix} \cos(5\omega t) & -\sin(5\omega t) \\ \sin(5\omega t) & \cos(5\omega t) \end{bmatrix} \begin{bmatrix} V5d3 \\ V5q3 \end{bmatrix} \quad (8)$$

In this manner, the fifth-order harmonic signals after the correction (V5d3, V5q3) represented by d-q-axis components are converted into three-phase control command signals by two-phase/three-phase conversion.

Seventh-order command generator 10b generates a compensation command value V7ref for compensating for the seventh-order harmonic voltages included in voltage Vs based on the seventh-order harmonic signals after the correction (V7d3, V7q3) subjected to phase correction, using Equation (9) below. Assuming that the compensation command values of the seventh-order harmonic voltages of a-phase, b-phase, and c-phase are V7Aref, V7Bref, and V7Cref, respectively, V7ref=(V7Aref, V7Bref, V7Cref).

[Math 7]

$$\begin{bmatrix} V7Aref \\ V7Bref \\ V7Cref \end{bmatrix} = \begin{bmatrix} 1 & 0 \\ -1/2 & \sqrt{3}/2 \\ -1/2 & -\sqrt{3}/2 \end{bmatrix} \begin{bmatrix} \cos(7\omega t) & -\sin(7\omega t) \\ \sin(7\omega t) & \cos(7\omega t) \end{bmatrix} \begin{bmatrix} V7d3 \\ V7q3 \end{bmatrix} \quad (9)$$

In this manner, the seventh-order harmonic signals after the correction (V7d3, V7q3) represented by d-q-axis components are inversely converted into three-phase control command signals. Herein, Equation (9) reflects that the phase sequence of three phases of the seventh-order harmonic voltages is in positive phase.

Three-phase combiner 11 combines compensation command value V5ref and compensation command value V7ref that are three-phase control command signals. Specifically, three-phase combiner 11 outputs a harmonic compensation command value VHref, which is obtained by addition of compensation command value V5ref and compensation command value V7ref, to output controller 18.

Output controller 18 controls an output of active filter 80 based on harmonic compensation command value VHref for suppression of a harmonic supplied from three-phase combiner 11. Note that output controller 18 also has a function of generating a reactive current compensation command value for suppression of voltage fluctuations to stabilize the voltage of the power system. Specifically, output controller 18 includes a DC voltage controller 18a, an AC voltage controller 18b, an output current controller 18c, and a PWM controller 18d.

DC voltage controller 18a receives an input of DC voltage Vdc of the capacitor of self-excited converter 81 and adjusts a phase of a fundamental wave output voltage of self-excited converter 81 such that DC voltage Vdc maintains a constant value. Specifically, DC voltage controller 18a calculates an active current reference value Vqref for controlling an active current output from self-excited converter 81 such that DC voltage Vdc maintains a constant value. DC voltage controller 18a controls components of a fundamental wave voltage output from self-excited converter 81 which relate to the active current.

AC voltage controller 18b receives an input of voltage Vs and adjusts the magnitude of the fundamental wave output voltage of self-excited converter 81 so as to maintain the fundamental wave voltage included in voltage Vs at a constant value. Specifically, AC voltage controller 18b calculates a reactive current reference value Vdref so as to maintain the fundamental wave voltage included in voltage Vs at a constant value. AC voltage controller 18b controls components of the fundamental wave voltage output from self-excited converter 81 which relate to the reactive current.

Output current controller 18c calculates an active current command value Iqref corresponding to active current reference value Vqref and a reactive current command value Idref corresponding to reactive current reference value Vdref. Output current controller 18c generates a fundamental wave compensation command value VBref corresponding to a deviation between active current command value Iqref and reactive current command value Idref, and output current Io output from self-excited converter 81. Fundamental wave compensation command value VBref acts as a fundamental wave compensation command value obtained by combining a fundamental wave reactive current compensation command value for suppression of voltage fluctuations of installation point 4a and a fundamental wave active current compensation command value for maintaining the capacitor voltage of self-excited converter 81 constant.

Output current controller 18c generates a compensation command value Vref obtained by addition of harmonic compensation command value VHref and fundamental wave compensation command value VBref and outputs compensation command value Vref to PWM controller 18d.

PWM controller 18d generates a gate pulse signal G for self-excited converter 81 to output a three-phase AC voltage corresponding to compensation command value Vref, in accordance with PWM control. PWM controller 18d outputs the generated gate pulse signal G to self-excited converter 81.

<Phase Correction Method>

A phase correction method by phase corrector 9 according to the present embodiment will now be described.

Figure 6:
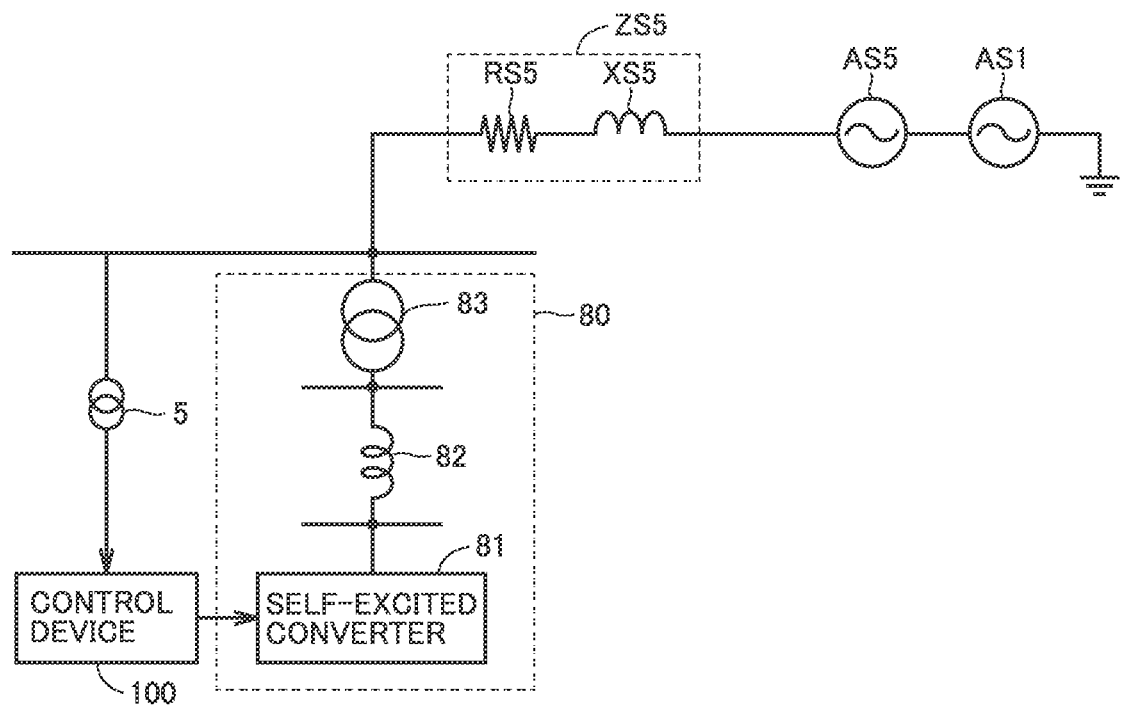
FIG. 6 shows an equivalent circuit used for illustrating a phase correction method according to Embodiment 1.

FIG. 6 shows an equivalent circuit used for illustrating a phase correction method according to Embodiment 1. For example, a phase correction method for suppression of a fifth-order harmonic will now be described. Referring to FIG. 6, active filter 80 is connected to a power system having an impedance ZS5 (=RS5+jXS5) of a fifth-order harmonic, and control device 100 controls active filter 80. Additionally, a voltage supply AS5 of the fifth-order harmonic is connected in series with voltage supply AS1 of the fundamental wave. RS5 and XS5 represent a resistance and a reactance of the fifth-order harmonic, respectively.

A harmonic reduction rate DH5 at which phase correction angle θ5 is changed with gain constant K5 maintained constant in the equivalent circuit as shown in FIG. 6 will be described with reference to FIG. 7.

Figure 7:
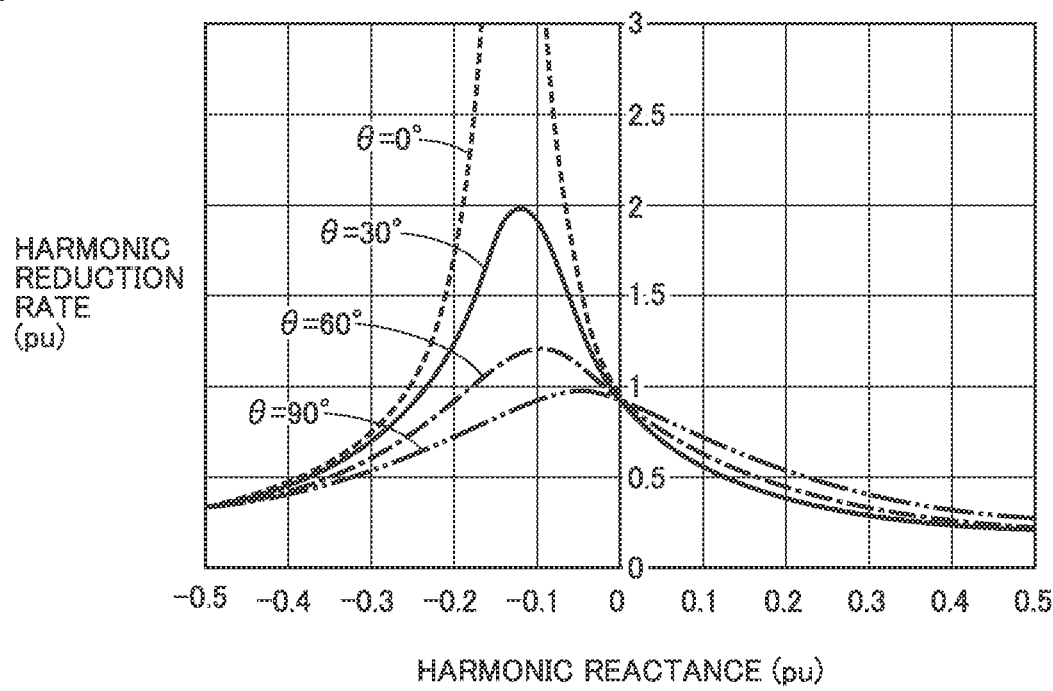
FIG. 7 shows a relation between a phase correction angle and a harmonic reduction rate according to Embodiment 1.

FIG. 7 shows a relation between a phase correction angle and a harmonic reduction rate according to Embodiment 1. Referring to FIG. 7, the transverse axis indicates reactance XS5 of the fifth-order harmonic, and the vertical axis indicates harmonic reduction rate DH5. Harmonic reduction rate DH5 is defined by a ratio of the fifth-order harmonic voltage of the power system to the fifth-order harmonic voltage of voltage supply AS5.

In FIG. 7, changes of harmonic reduction rate DH5 to reactance XS5 of the fifth-order harmonic are shown with phase correction angle θ5 as a parameter. It is shown that the fifth-order harmonic impedance on the system side is inductive when reactance XS5 is positive. It is shown that the fifth-order harmonic impedance on the system side is capacitive when reactance XS5 is negative. Additionally, it is shown that the harmonic has increased when harmonic reduction rate DH5>1 and that the harmonic has decreased when harmonic reduction rate DH5<1.

As shown in FIG. 7, it is found that when reactance XS5 is positive, harmonic reduction rate DH5 is the smallest at a phase correction angle θ5 of 0°, and the harmonic reducing effect is large. As phase correction angle θ5 is increased from 0°, harmonic reduction rate DH5 increases, and the harmonic reducing effect decreases. However, the following is found: when reactance XS5 is positive, harmonic reduction rate DH5<1 is satisfied even when phase correction angle θ5 is increased to 90°, and accordingly, the harmonic reducing effect is achieved to a certain degree.

Contrastingly, it is found that when reactance XS5 is negative, harmonic reduction rate DH5 greatly exceeds one at a phase correction angle θ5 of 0° to 30°, thus increasing a harmonic. When phase correction angle θ5 is set to 60° to 90°, however, harmonic reduction rate DH5 attains to about one or falls below one, yielding the harmonic reducing effect to a certain degree.

Considering the above, fifth-order phase corrector 9a advances the phase of the fifth-order harmonic voltage signal by phase correction angle θ5 when impedance ZS5 of the fifth-order harmonic is capacitive. In other words, fifth-order phase corrector 9a shifts the phase of the fifth-order harmonic voltage signal in the direction of advance by phase correction angle θ5. Phase correction angle θ5 is typically set to 60° to 90°. Contrastingly, when impedance ZS5 of the fifth-order harmonic is inductive, fifth-order phase corrector 9a does not correct the phase of the fifth-order harmonic voltage signal. In other words, phase correction angle θ5 is set to 0°.

The phase of the fifth-order harmonic voltage signal is corrected as described above, and accordingly, the harmonic reducing effect can be enhanced even when impedance ZS5 is capacitive or inductive.

A phase correction method for a seventh-order harmonic voltage signal is similar to the phase correction method for a fifth-order harmonic voltage signal described above. Specifically, seventh-order phase corrector 9b advances the phase of the seventh-order harmonic voltage signal by phase correction angle θ7 when impedance ZS7 of the seventh-order harmonic is capacitive. Phase correction angle θ7 is typically set to 60° to 90°. Seventh-order phase corrector 9b does not correct the phase of the seventh-order harmonic voltage signal when impedance ZS7 of the seventh-order harmonic is inductive. In other words, phase correction angle θ7 is set to 0°.

It suffices that the system operator preliminarily checks whether each of impedances ZS5, ZS7 is capacitive or inductive by simulation or the like and sets phase correction angles θ5, θ7 based on a check result. It also suffices that when the impedance characteristics change in accordance with the system conditions, the system operator preliminarily checks system conditions on which each of impedances ZS5, ZS7 is rendered capacitive or inductive and sets phase correction angles θ5, θ7 based on a check result.

<Advantageous Effects>

Embodiment 1 can reduce a harmonic even when the harmonic impedance indicates any of the inductive state and the capacitive state by appropriate phase correction according to harmonic impedance characteristics.

Since the respective phases of the fifth-order harmonic voltage signal and the seventh-order harmonic voltage signal can be corrected independently, the fifth-order harmonic and the seventh-order harmonic can be reduced even when the impedance characteristics of the fifth-order harmonic are different from the impedance characteristics of the seventh-order harmonic.

Embodiment 2

Embodiment 1 has described the configuration in which the phases of the fifth-order harmonic voltage signal and the seventh-order harmonic voltage signal are corrected in accordance with the impedance characteristics preliminarily checked. Embodiment 2 will describe a configuration in which the impedance characteristics of the fifth-order harmonic and the seventh-order harmonic are determined by monitoring compensation command values V5ref, V7ref, and based on a result of the determination, the phases of the fifth-order harmonic voltage signal and the seventh-order harmonic voltage signal are corrected. Note that the overall configuration and the hardware configuration of the control device in Embodiment 2 are similar to those of Embodiment 1.

<Functional Configuration>

Figure 8:
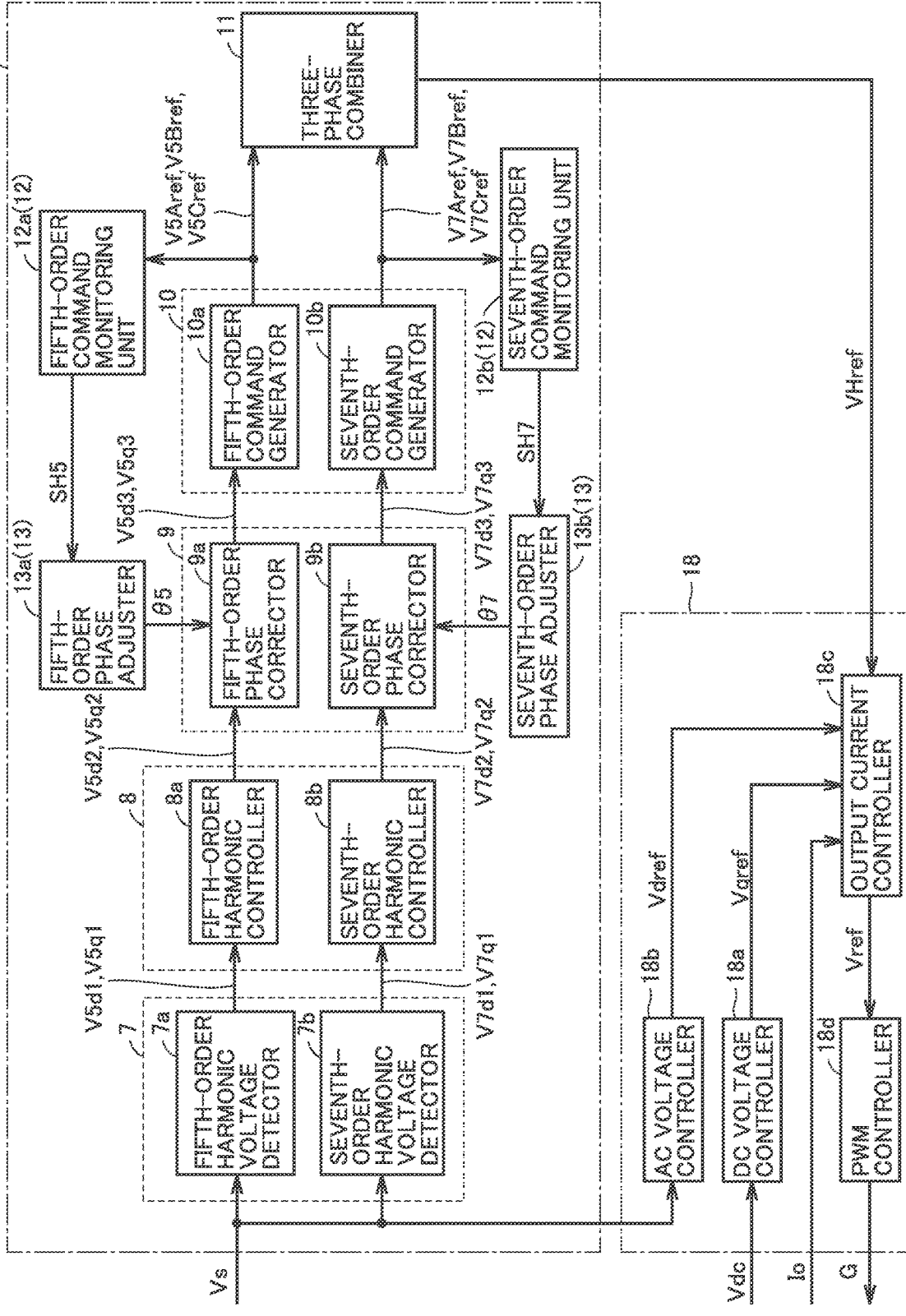
FIG. 8 is a schematic diagram showing a functional configuration of a control device according to Embodiment 2.

FIG. 8 is a schematic diagram showing a functional configuration of a control device 100A according to Embodiment 2. Referring to FIG. 8, control device 100A includes a harmonic compensator 17A and output controller 18. Control device 100A corresponds to control device 100 shown in FIG. 3, and is additionally assigned with symbol "A" for convenience's sake in order to differentiate it from any other embodiment. This also applies to Embodiment 3.

Harmonic compensator 17A has a configuration obtained by adding a monitoring unit 12 and a phase adjuster 13 to harmonic compensator 17. The same components of harmonic compensator 17A as those of harmonic compensator 17 and output controller 18 will not be repeatedly described in detail.

Monitoring unit 12 includes a fifth-order command monitoring unit 12a, which monitors compensation command value V5ref output from fifth-order command generator 10a, and a seventh-order command monitoring unit 12b, which monitors compensation command value V7ref output from seventh-order command generator 10b. Phase adjuster 13 includes a fifth-order phase adjuster 13a, which adjusts phase correction angle θ5 in accordance with a signal from fifth-order command monitoring unit 12a, and a seventh-order phase adjuster 13b, which adjusts phase correction angle θ7 in accordance with a signal from seventh-order command monitoring unit 12b.

Herein, when the fifth-order harmonic impedance is inductive on the normal system conditions as shown in FIG. 7, phase correction angle θ5 is desirably set to 0° for maximization of the harmonic reducing effect. However, when phase correction is not performed (i.e., when phase correction angle θ5 is maintained at 0°) in the case where the system conditions temporarily change due to a system fault or the like and the fifth-order harmonic impedance changes from the inductive state to the capacitive state, fifth-order harmonic control becomes unstable, leading to an unusual increase in the output of active filter 80.

Thus, when the impedance of the fifth-order harmonic changes from an inductive state to the capacitive state, compensation command value V5ref increases rapidly. Fifth-order command monitoring unit 12a accordingly determines that the impedance of the fifth-order harmonic has changed from the inductive state to the capacitive state when compensation command value V5ref has increased rapidly.

Fifth-order command monitoring unit 12a determines whether the impedance of the fifth-order harmonic has changed from the inductive state to the capacitive state based on compensation command value V5ref. Specifically, fifth-order command monitoring unit 12a determines that the impedance of the fifth-order harmonic is capacitive when an effective value of compensation command value V5ref is greater than a threshold V5m. In this case, fifth-order command monitoring unit 12a outputs a phase advance command for advancing a phase of a fifth-order harmonic voltage signal to fifth-order phase adjuster 13a. Fifth-order phase adjuster 13a sets phase correction angle θ5 in accordance with the phase advance command and outputs the set phase correction angle θ5 to fifth-order phase corrector 9a.

More specific configurations and operations of fifth-order command monitoring unit 12a and fifth-order phase adjuster 13a will now be described with the case of fifth-order harmonic control as a representative example.

Figure 9:
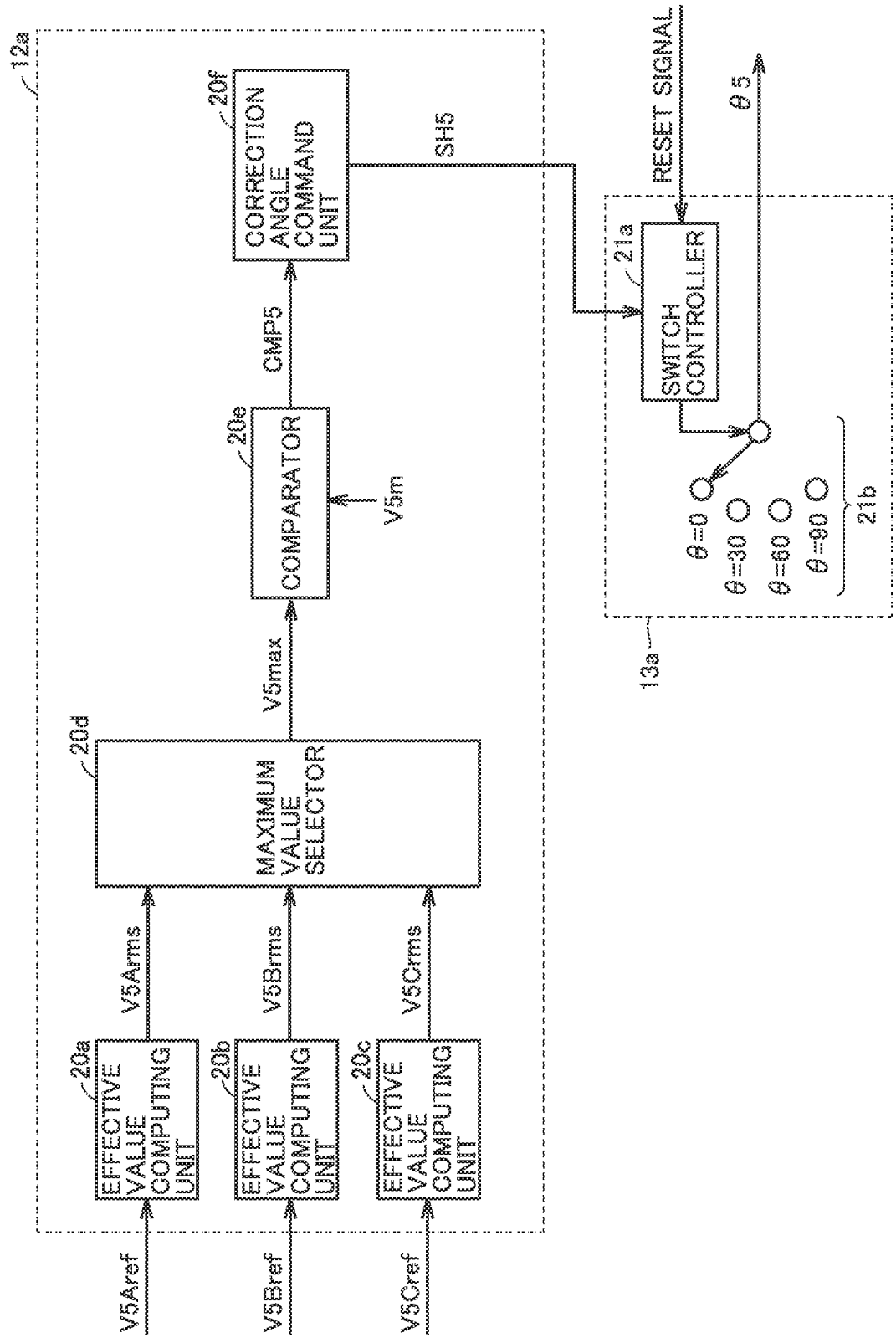
FIG. 9 is a schematic diagram showing configurations of a fifth-order command monitoring unit and a fifth-order phase adjuster according to Embodiment 2.

FIG. 9 is a schematic diagram showing configurations of fifth-order command monitoring unit 12a and fifth-order phase adjuster 13a according to Embodiment 2. Referring to FIG. 9, fifth-order command monitoring unit 12a includes effective value computing units 20a to 20c, a maximum value selector 20d, a comparator 20e, and a correction angle command unit 20f. Fifth-order phase adjuster 13a includes a switch controller 21a and a selection switch 21b.

Effective value computing unit 20a computes an effective value V5Arms of compensation command value V5Aref, which is an a-phase component of compensation command value V5ref. Effective value computing unit 20b computes an effective value V5Brms of compensation command value V5Bref, which is a b-phase component. Effective value computing unit 20c computes an effective value V5Crms of compensation command value V5Cref, which is a c-phase component.

Maximum value selector 20d selects a maximum effective value as maximum value V5max from among the computed effective values V5Arms, V5Brms, V5Crms of three phases. Comparator 20e compares maximum value V5max with threshold V5m and outputs a signal CMP5 indicative of a result of the comparison. For example, signal CMP5 indicates a value "1" when V5max>V5m, and signal CMP5 indicates a value "0" when V5max≤V5m.

During a period in which signal CMP5 is "1", correction angle command unit 20f periodically outputs a command signal SH5 for increasing phase correction angle θ5 to switch controller 21a. The reason for this is as follows: when signal CMP5 indicates "1", fifth-order harmonic control is unstable, and accordingly, it can be determined that the impedance of the fifth-order harmonic is at least capacitive.

Upon receipt of an input of command signal SH5, switch controller 21a shifts selection switch 21b by one stage in the direction in which the phase angle advances, thereby advancing phase correction angle θ5 by a reference angle (e.g., 30°). For example, upon receipt of an input of command signal SH5 while phase correction angle θ5 is 0°, switch controller 21a shifts selection switch 21b by one stage so as to set phase correction angle θ5 to 30°.

Note that when fifth-order harmonic control becomes stable by increasing phase correction angle θ5 and CMP5 output from comparator 20e attains to the value "0", correction angle command unit 20f does not output command signal SH5.

Accordingly, phase correction angle θ5 maintains a present value, and fifth-order harmonic control based on the maintained phase correction angle θ5 is performed.

Subsequently, the system operator may manually provide switch controller 21a with a reset signal after checking that the fifth-order harmonic impedance has changed to the inductive state. In this case, switch controller 21a shifts the phase angle by one stage in the direction of delay, thereby delaying phase correction angle θ5 by the reference angle. For example, upon receipt of an input of the reset signal while phase correction angle θ5 is 90°, switch controller 21a shifts selection switch 21b by one stage so as to set phase correction angle θ5 to 60°.

Note that phase correction angle θ5 is 0° in the initial state, and accordingly, correction angle command unit 20f can count the number of command signals SH5 output to switch controller 21a, so that at any of 0° to 90° phase correction angle θ5 is set can be ascertained. For example, phase correction angle θ5 is set at 0° when the number is "0", and phase correction angle θ5 is set at 30° when the number is "1".

Thus, when detecting that the value of the input signal CMP5 has changed from "0" to "1" with phase correction angle θ5 at 0°, correction angle command unit 20f can determine that the impedance of the fifth-order harmonic has changed from the inductive state to the capacitive state.

In another aspect, comparator 20e may be configured to further compare threshold V5mt smaller than threshold V5m with maximum value V5max and output a signal CMP5t as a result of the comparison. In this case, signal CMP5t indicates the value "1" when V5max>V5mt, and signal CMP5t indicates the value "0" when V5max≤V5m (i.e., maximum value V5max is extremely small).

During a period in which signal CMP5t is "1", correction angle command unit 20f does not perform an operation based on signal CMP5t. Contrastingly, during a period in which signal CMP5t is "0", correction angle command unit 20f periodically outputs a reset signal to switch controller 21a so as to decrease phase correction angle θ5. The reason for this is as follows: when signal CMP5t is "0", fifth-order harmonic control is remarkably stable, and accordingly, it can be determined that the fifth-order harmonic impedance has changed in the direction from the capacitive state toward the inductive state.

In this case, switch controller 21a shifts phase correction angle θ5 by one stage in the direction of delay, thereby delaying phase correction angle θ5 by a reference angle. With this configuration, the reset signal can be provided automatically to switch controller 21a without the system operator checking that the fifth-order harmonic impedance has changed to the inductive state.

Referring again to FIG. 8, fifth-order phase corrector 9a corrects the phase of the fifth-order harmonic voltage signal in accordance with phase correction angle θ5. Since fifth-order command monitoring unit 12a and fifth-order phase adjuster 13a operate as described above, fifth-order phase corrector 9a operates as follows.

Specifically, fifth-order phase corrector 9a advances the phase of the fifth-order harmonic voltage signal by the reference angle when the impedance of the fifth-order harmonic is determined to be capacitive. When the impedance of the fifth-order harmonic is determined to be capacitive after advancing the phase of the fifth-order harmonic voltage signal by the reference angle, fifth-order phase corrector 9a advances the phase of the fifth-order harmonic voltage signal, which has been advanced by the reference angle, additionally by the reference angle.

Note that when the impedance of the fifth-order harmonic changes to the inductive state after advancing the phase of the fifth-order harmonic voltage signal by the reference angle, fifth-order phase corrector 9a delays the phase of the fifth-order harmonic voltage signal, which has been advanced by the reference angle, by the reference angle.

The functions of seventh-order command monitoring unit 12b and seventh-order phase adjuster 13b are similar to the functions of fifth-order command monitoring unit 12a and fifth-order phase adjuster 13a described above, respectively.

Seventh-order command monitoring unit 12b determines whether the impedance of the seventh-order harmonic has changed from the inductive state to the capacitive state based on compensation command value V7ref. Specifically, seventh-order command monitoring unit 12b determines that the impedance of the seventh-order harmonic is capacitive when the effective value of compensation command value V7ref is greater than threshold V7m. In this case, seventh-order command monitoring unit 12b outputs a phase advance command for advancing the phase of the seventh-order harmonic voltage signal to seventh-order phase adjuster 13b.

Seventh-order phase adjuster 13b sets phase correction angle θ7 in accordance with the phase advance command and outputs the set phase correction angle θ7 to seventh-order phase corrector 9b. Seventh-order phase corrector 9b corrects the phase of the seventh-order harmonic voltage signal in accordance with phase correction angle θ7.

<Advantageous Effects>

Embodiment 2 can detect that the harmonic impedance characteristics have changed from the inductive state to the capacitive state and automatically correct the phase in the direction of advance in accordance with the change, thereby stabilizing harmonic control.

Embodiment 2 can also provide a reset signal to correct a phase in the direction of delay, thereby decreasing the phase correction angle within the range in which harmonic control is stable. As a result, an active filter can be controlled stably while maintaining a high harmonic restraining effect.

Embodiment 3

Embodiment 1 has described the configuration in which the phases of the fifth-order harmonic voltage signal and the seventh-order harmonic voltage signal are corrected in accordance with the impedance characteristics checked in advance.

Embodiment 3 will describe a configuration in which an impedance is actually calculated and the phases of the fifth-order harmonic voltage signal and the seventh-order harmonic voltage signal are corrected based on the calculated impedance. Note that the overall configuration and the hardware configuration of the control device in Embodiment 3 are similar to those of Embodiment 1.

<Functional Configuration>

Figure 10:
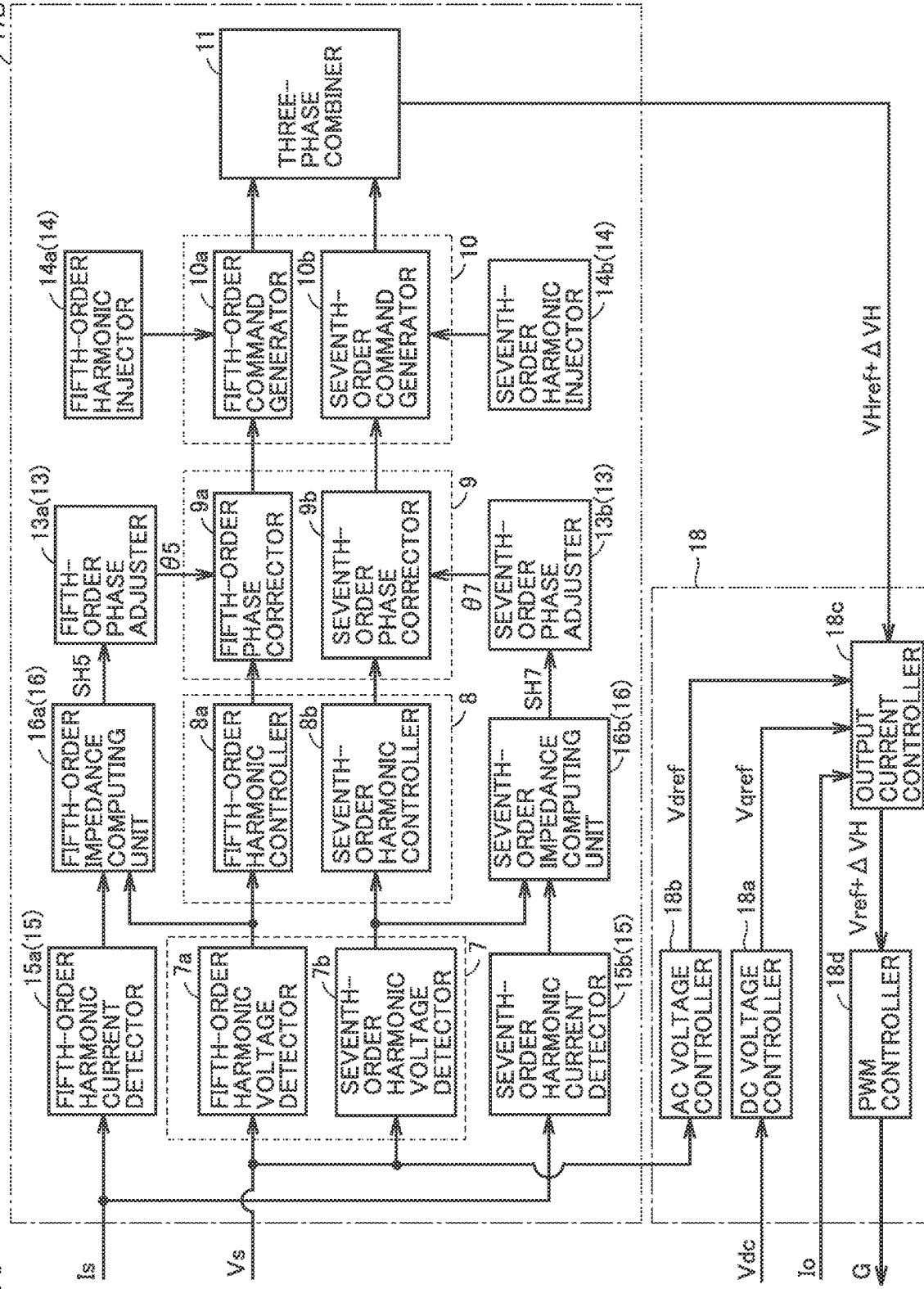
FIG. 10 is a schematic diagram showing a functional configuration of a control device according to Embodiment 3.

FIG. 10 is a schematic diagram showing a functional configuration of a control device 100B according to Embodiment 3. Referring to FIG. 10, control device 100B includes a harmonic compensator 17B and output controller 18. Harmonic compensator 17B has a configuration obtained by adding phase adjuster 13, a harmonic injector 14, a harmonic current detector 15, and an impedance computing unit 16 to harmonic compensator 17. The same components of harmonic compensator 17B as those of harmonic compensator 17 and output controller 18 will not be repeatedly described in detail.

Harmonic injector 14 injects a voltage command value for causing the power system to generate a harmonic reference current into command generator 10. Specifically, harmonic injector 14 includes a fifth-order harmonic injector 14a and a seventh-order harmonic injector 14b.

Fifth-order harmonic injector 14a injects a reference command value ΔVH5 for generating a fifth-order harmonic reference current ΔIH5 into fifth-order command generator 10a. Fifth-order command generator 10a of control device 100B outputs a command value obtained by adding voltage command value ΔVH5 to compensation command value V5ref to three-phase combiner 11. Seventh-order harmonic injector 14b injects a reference command value ΔVH7 for generating a seventh-order harmonic reference current ΔIH7 into seventh-order command generator 10b. Seventh-order command generator 10b of control device 100B outputs a command value obtained by adding reference command value ΔVH7 to compensation command value V7ref to three-phase combiner 11.

Three-phase combiner 11 generates a reference command value ΔVH obtained by combining reference command value ΔVH5 and reference command value ΔVH7 and outputs a voltage command value obtained by adding reference command value ΔVH to harmonic compensation command value VHref to output current controller 18c.

Output current controller 18c generates a voltage command value (Vref+ΔVH) obtained by additionally adding reference command value ΔVH to compensation command value Vref, which is obtained by addition of harmonic compensation command value VHref and fundamental wave compensation command value VBref, and outputs the voltage command value to PWM controller 18d. PWM controller 18d generates a gate pulse signal G for outputting a three-phase AC voltage corresponding to the voltage command value (Vref+ΔVH) in accordance with PWM control, and outputs the generated gate pulse signal G to self-excited converter 81.

Active filter 80 thus outputs, to installation point 4a, a current obtained by adding fifth-order harmonic reference current ΔIH5 and seventh-order harmonic reference current ΔIH7 injected from harmonic injector 14 to a compensating current for suppression of a harmonic and a compensating current for suppression of voltage fluctuations.

Harmonic current detector 15 individually detects a harmonic current component of each order to be compensated for, from a current Is=(Ia, Ib, Ic) detected by current transformer 6. Specifically, harmonic current detector 15 includes a fifth-order harmonic current detector 15a, which detects a fifth-order harmonic current included in current Is output to installation point 4a by active filter 80, and a seventh-order harmonic current detector 15b, which detects a seventh-order harmonic current included in current Is.

Fifth-order harmonic current detector 15a detects fifth-order harmonic current components of three phases as a d-axis current value and a q-axis current value on the rotation axis coordinates synchronized with the fifth-order harmonic frequency. In other words, fifth-order harmonic current detector 15a detects fifth-order harmonic currents (I5d1, I5q1) from three-phase AC currents (Ia, Ib, Ic) using Equations (10) and (11) below. In the description below, the fifth-order harmonic currents (I5d1, I5q1) are also referred to as "fifth-order harmonic current detection values".

Fifth-order harmonic current detector 15a first converts three-phase AC currents into αβ components (Iα, Iβ) using a conversion equation expressed by Equation (10).

[Math 8]

$$\begin{bmatrix} I\alpha \\ I\beta \end{bmatrix} = \frac{2}{3} \begin{bmatrix} 1 & -1/2 & -1/2 \\ 0 & \sqrt{3}/2 & -\sqrt{3}/2 \end{bmatrix} \begin{bmatrix} Ia \\ Ib \\ Ic \end{bmatrix} \quad (10)$$

Fifth-order harmonic current detector 15a then converts the αβ components (Iα, Iβ) into dq components (I5d1, I5q1) of the fifth-order harmonic current using a conversion equation expressed by Equation (11).

[Math 9]

$$\begin{bmatrix} I5d1 \\ I5q1 \end{bmatrix} = \begin{bmatrix} \cos(5\omega t) & \sin(5\omega t) \\ -\sin(5\omega t) & \cos(5\omega t) \end{bmatrix} \begin{bmatrix} I\alpha \\ -I\beta \end{bmatrix} \quad (11)$$

Seventh-order harmonic current detector 15b detects seventh-order harmonic current components of three phases as d-q-axis components on the rotation axis coordinates synchronized with the seventh-order harmonic frequency. Specifically, seventh-order harmonic current detector 15b detects seventh-order harmonic currents (I7d1, I7q1) from three-phase currents (Ia, Ib, Ic) using Equation (10) above and Equation (12) below. In the description below, the seventh-order harmonic currents (I7d1, I7q1) are also referred to as "seventh-order harmonic current detection values".

[Math 10]

$$\begin{bmatrix} I7d1 \\ I7q1 \end{bmatrix} = \begin{bmatrix} \cos(7\omega t) & \sin(7\omega t) \\ -\sin(7\omega t) & \cos(7\omega t) \end{bmatrix} \begin{bmatrix} I\alpha \\ I\beta \end{bmatrix} \quad (12)$$

Impedance computing unit 16 computes a harmonic impedance based on the detected harmonic voltage and harmonic current. Specifically, impedance computing unit 16 includes a fifth-order impedance computing unit 16a and a seventh-order impedance computing unit 16b.

Fifth-order impedance computing unit 16a computes impedance ZS5 of the fifth-order harmonic based on the fifth-order harmonic voltage detection values (V5d1, V5q1) and the fifth-order harmonic current detection values (I5d1, I5q1). Fifth-order impedance computing unit 16a determines whether impedance ZS5 is capacitive or inductive based on the polarity of the phase of impedance ZS5.

Seventh-order impedance computing unit 16b computes impedance ZS7 of the seventh-order harmonic based on the seventh-order harmonic voltage detection values (V7d1, V7q1) and the seventh-order harmonic current detection values (I7d1, I7q1). Seventh-order impedance computing unit 16b determines whether impedance ZS7 is capacitive or inductive based on the polarity of the phase of impedance ZS7.

More specific configurations and operations of fifth-order impedance computing unit 16a and fifth-order phase adjuster 13a will now be described with the case of fifth-order harmonic control as a representative example.

Figure 11:
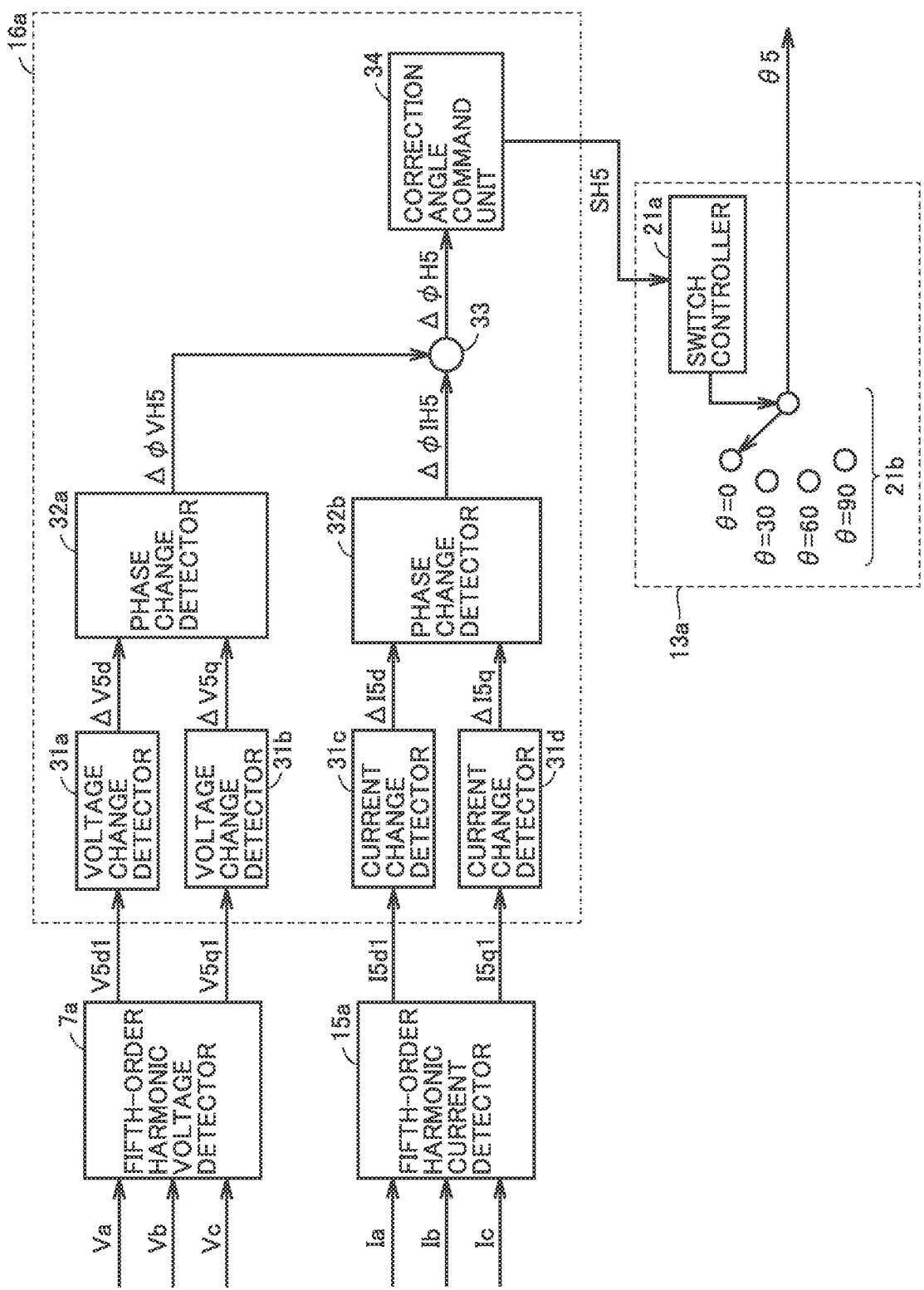
FIG. 11 is a schematic diagram showing configurations of a fifth-order impedance computing unit and a fifth-order phase adjuster according to Embodiment 3.

FIG. 11 is a schematic diagram showing configurations of fifth-order impedance computing unit 16a and fifth-order phase adjuster 13a according to Embodiment 3. Referring to FIG. 11, fifth-order impedance computing unit 16a includes voltage change detectors 31a, 31b, current change detectors 31c, 31d, phase change detectors 32a, 32b, a subtractor 33, and a correction angle command unit 34. Fifth-order phase adjuster 13a includes a switch controller 21a and a selection switch 21b.

Voltage change detector 31a detects a change amount $\Delta V5d$ of d-axis voltage V5d1 of the input fifth-order harmonic voltage. Voltage change detector 31b detects a change amount $\Delta V5q$ of q-axis voltage V5q1 of the input fifth-order harmonic voltage. Voltage change detectors 31a, 31b are configured with, for example, highpass filters. Voltage change amounts $\Delta V5d$, $\Delta V5q$ are voltage change amounts caused by injection of reference command value $\Delta VH5$ by fifth-order harmonic injector 14a.

Current change detector 31c detects a change amount $\Delta I5d$ of d-axis current I5d1 of the input fifth-order harmonic current. Current change detector 31d detects a change amount $\Delta I5q$ of q-axis current I5q1 of the input fifth-order harmonic current. Current change detectors 31c, 31d are configured with, for example, highpass filters. Change amounts $\Delta I5d$, $\Delta I5q$ are current change amounts caused by injection of reference command value $\Delta VH5$ by fifth-order harmonic injector 14a. In other words, current change amounts $\Delta I5d$ and $\Delta I5q$ correspond to the d-axis component and the q-axis component of fifth-order harmonic reference current $\Delta IH5$, respectively.

Phase change detector 32a calculates a phase angle $\Delta\varphi VH5$ of a voltage change amount vector of the fifth-order harmonic using voltage change amounts $\Delta V5d$, $\Delta V5q$ and Equation (13) below.

[Math 11]

$$\Delta\varphi VH5 = \cos^{-1}\left(\frac{\Delta V5d}{\sqrt{(\Delta V5d)^2 + (\Delta V5q)^2}}\right) \quad (13)$$

Phase change detector 32b calculates a phase angle $\Delta\varphi IH5$ of a current change amount vector of the fifth-order harmonic using current change amounts $\Delta I5d$, $\Delta I5q$ and Equation (14) below.

[Math 12]

$$\Delta\varphi IH5 = \cos^{-1}\left(\frac{\Delta I5d}{\sqrt{(\Delta I5d)^2 + (\Delta I5q)^2}}\right) \quad (14)$$

Subtractor 33 subtracts phase angle $\Delta\varphi IH5$ of the current change amount vector from phase angle $\Delta\varphi VH5$ of the voltage change amount vector of the fifth-order harmonic using Equation (15) below, thereby calculating a phase angle $\Delta\varphi H5$ between the voltage change amount vector and the current change amount vector.

[Math 13]

$$\Delta\varphi H5 = \Delta\varphi VH5 - \Delta\varphi IH5 \quad (15)$$

Herein, $\Delta\varphi VH5$ corresponds to the phase of impedance ZS5 of the fifth-order harmonic. Correction angle command unit 34 can thus determine whether impedance ZS5 is inductive or capacitive based on the polarity of $\Delta\varphi VH5$. Specifically, correction angle command unit 34 determines that impedance ZS5 is inductive when the polarity of $\Delta\varphi VH5$ is positive and determines that impedance ZS5 is capacitive when the polarity of $\Delta\varphi VH5$ is negative.

Since the magnitude of phase angle $\Delta\varphi VH5$ is computed, the degrees of an inductive state and the capacitive state can be ascertained with high accuracy. Correction angle command unit 34 can thus compute a phase correction angle required for stable fifth-order harmonic control with high accuracy in accordance with the polarity and magnitude of $\Delta\varphi VHZ5$. For example, correction angle command unit 34 outputs command signal SH5, which will be described below, to switch controller 21a in accordance with the magnitude and polarity of phase angle $\Delta\varphi VHZ5$.

When $\Delta\varphi VH5 \geq 0$, correction angle command unit 34 outputs a value "1" to switch controller 21a as command signal SH5 for setting phase correction angle $\theta5$ to 0°. When $-30 \leq \Delta\varphi VH5 < 0$, correction angle command unit 34 outputs a value "2" to switch controller 21a as command signal SH5 for setting phase correction angle $\theta5$ to 30°. When $-60 \leq \Delta\varphi VH5 < -30$, correction angle command unit 34 outputs a value "3" to switch controller 21a as command signal SH5 for setting phase correction angle $\theta5$ to 60°. When $-90 \leq \Delta\varphi VH5 < -60$, correction angle command unit 34 outputs a value "4" to switch controller 21a as command signal SH5 for setting phase correction angle θ5 to 90°.

Switch controller 21a switches selection switch 21b in accordance with the value of the input command signal SH5, thereby setting phase correction angle θ5. For example, upon receipt of an input of command signal SH5 with the value "2", switch controller 21a shifts selection switch 21b so as to set phase correction angle θ5 to 30°. A signal indicative of the set phase correction angle θ5 is supplied to fifth-order phase corrector 9a.

Referring again to FIG. 10, fifth-order phase corrector 9a corrects the phase of the fifth-order harmonic voltage signal in accordance with the set phase correction angle θ5. Fifth-order impedance computing unit 16a and fifth-order phase adjuster 13a operate as described above, and accordingly, fifth-order phase corrector 9a operates as follows.

Specifically, when the impedance of the fifth-order harmonic is determined to be capacitive, fifth-order phase corrector 9a advances the phase of the fifth-order harmonic voltage signal by an angle corresponding to the magnitude of the phase of impedance ZS5 of the fifth-order harmonic. In other words, the phase of the fifth-order harmonic voltage signal shifts by an angle corresponding to the magnitude of the phase of impedance ZS5 in the direction of advance. For example, when $-60 \leq \Delta\phi VH5 < -30$, phase correction angle θ5 is set to 60°, and accordingly, fifth-order phase corrector 9a advances the phase of the fifth-order harmonic voltage signal by 60°.

Contrastingly, when impedance ZS5 of the fifth-order harmonic is determined to be inductive (i.e., when $\Delta\phi VH5 > 0$), phase correction angle θ5 is set to 0°. Fifth-order phase corrector 9a thus does not correct the phase of the fifth-order harmonic voltage signal.

Note that the functions of seventh-order impedance computing unit 16b, seventh-order phase adjuster 13b, and seventh-order phase corrector 9b are similar to the functions of fifth-order impedance computing unit 16a, fifth-order phase adjuster 13a, and fifth-order phase corrector 9a described above, respectively.

<Advantageous Effects>

Embodiment 3 can adjust a phase correction angle suitable for harmonic impedance characteristics of orders to be compensated for. Accordingly, an active filter apparatus can be provided that can control harmonic suppression regardless of system impedance characteristics and have an excellent harmonic suppression effect.

Other Embodiments (1) The embodiments above have described the configuration in which harmonics to be compensated for are a fifth-order harmonic and a seventh-order harmonic, but the present invention is not limited to such a configuration, and it suffices that harmonics of any appropriate order are to be compensated for. For example, an m-order harmonic (m is an integer not less than two) and an n-order harmonic (n is an integer which is different from m and is not less than two) are to be compensated for. The number of harmonics to be compensated for may be only one (e.g., only m-order harmonic), or three or more.

For example, when a harmonic to be compensated for is only the fifth-order harmonic, the function corresponding to the seventh-order harmonic in each of FIGS. 5, 8, and 10 may be eliminated. Contrastingly, when three or more harmonics are to be compensated for, the functions corresponding to the respective orders may be provided to the harmonic suppression unit shown in each of FIGS. 5, 8, and 10. For example, when a fifth-order harmonic, a seventh-order harmonic, and a ninth-order harmonic are to be compensated for, the function corresponding to the ninth-order harmonic may be added to the harmonic suppression unit shown in each of FIGS. 5, 8, and 10.

(2) The embodiments above have described the configuration in which control device 100 generates the reactive current compensation command value for suppression of voltage fluctuations of the power system in addition to the compensation command value for suppression of a harmonic, but the present invention is not limited to such a configuration. For example, control device 100 may be configured to generate only a compensation command value for suppression of a harmonic and generate no reactive current compensation command value. In this case, output controller 18 controls an output of active filter 80 based on harmonic compensation command value VHref for suppression of a harmonic. Specifically, PWM controller 18d generates a gate pulse signal G for outputting a three-phase AC voltage corresponding to harmonic compensation command value VHref in accordance with PWM control and outputs the generated gate pulse signal G to self-excited converter 81.

(3) The configurations illustrated as the embodiments above are merely examples of the configuration of the present invention, and can be combined with another known technique or can be modified by being omitted partially, for example, without going beyond the scope of the present invention. Moreover, the embodiments described above may be implemented, employing the processes and configurations described in other embodiments as appropriate.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

2 AC power supply; 3, ZS system impedance; 4 bus; 4a, M installation point; 4b, RL load; 5 voltage transformer; 6, 84 current transformer; 7 harmonic voltage detector; 8 harmonic controller; 9 phase corrector; 10 command generator; 11 three-phase combiner; 12 monitoring unit; 13 phase adjuster; 14 harmonic injector; 15 harmonic current detector; 16 impedance computing unit; 17, 17A, 17B harmonic compensator; 18 output controller; 18a DC voltage controller; 18b AC voltage controller; 18c output current controller; 18d PWM controller; 20a, 20b, 20c effective value computing unit; 20d maximum value selector; 20e comparator; 20f, 34 correction angle command unit; 21a switch controller; 21b selection switch; 31a, 31b voltage change detector; 31c, 31d current change detector; 32a, 32b phase change detector; 33 subtractor; 51 auxiliary transformer; 52 signal converter unit; 70 arithmetic processing unit; 71 bus; 72 CPU; 73 ROM; 74 RAM; 75 DI circuit; 76 DO circuit; 77 input interface; 80 active filter; 81 self-excited converter; 82 interconnection reactor; 83 transformer; 100, 100A, 100B control device; 1000, AF active filter apparatus; SC1, SC2 phase advance capacitor; XS5 reactance; Z0 power line impedance; ZS5, ZS7 impedance.

The invention claimed is:

1. A control device for an active filter connected in parallel with a load at an installation point with respect to an AC power supply provided in a power system, the control device comprising:

a harmonic voltage detector to detect an m-order harmonic voltage (m is an integer not less than two) included in a voltage of the installation point;

a phase corrector to correct a phase of the detected m-order harmonic voltage in accordance with whether an m-order harmonic impedance when an AC power supply side is seen from the installation point is capacitive or inductive;

a command value generator to generate a first compensation command value for compensating for the m-order harmonic voltage included in the voltage of the installation point based on the m-order harmonic voltage after the correction; and an output controller to control an output of the active filter based on the first compensation command value, wherein the phase corrector does not correct the phase of the detected m-order harmonic voltage when the m-order harmonic impedance is inductive.

2. The control device according to claim 1, wherein the phase corrector advances the phase of the detected m-order harmonic voltage by a first angle when the m-order harmonic impedance is capacitive.

3. The control device according to claim 2, wherein the first angle is 60° to 90°.

4. The control device according to claim 1, further comprising a monitoring unit to monitor the first compensation command value, wherein the monitoring unit determines whether the m-order harmonic impedance has changed from an inductive state to a capacitive state based on the first compensation command value.

5. The control device according to claim 4, wherein the monitoring unit determines that the m-order harmonic impedance is capacitive when an effective value of the first compensation command value is greater than a first threshold.

6. The control device according to claim 4, wherein the phase corrector advances the phase of the detected m-order harmonic voltage by a reference angle when the m-order harmonic impedance is determined to be capacitive.

7. The control device according to claim 6, wherein when the m-order harmonic impedance is determined to be capacitive after advancing the phase of the detected m-order harmonic voltage by the reference angle, the phase corrector advances the phase of the m-order harmonic voltage advanced by the reference angle additionally by the reference angle.

8. The control device according to claim 1, further comprising:

a harmonic current detector to detect an m-order harmonic current included in a current output to the installation point by the active filter; and an impedance computing unit to compute the m-order harmonic impedance based on the detected m-order harmonic voltage and the detected m-order harmonic current, wherein the impedance computing unit determines whether the m-order harmonic impedance is capacitive or inductive based on a polarity of a phase of the computed m-order harmonic impedance.

9. The control device according to claim 8, wherein the phase corrector advances the phase of the detected m-order harmonic voltage by an angle corresponding to magnitude of the phase of the m-order harmonic impedance when the m-order harmonic impedance is determined to be capacitive.

10. The control device according to claim 1, wherein the harmonic voltage detector further detects an n-order harmonic voltage (n is an integer different from m and not less than two) included in the voltage, the phase corrector corrects a phase of the detected n-order harmonic voltage in accordance with whether an n-order harmonic impedance when the AC power supply side is seen from the installation point is capacitive or inductive, the command value generator generates a second compensation command value for compensating for the n-order harmonic voltage included in the voltage of the installation point based on the n-order harmonic voltage after the correction, and the output controller controls the output of the active filter based on the first compensation command value and the second compensation command value.

11. The control device according to claim 5, wherein the phase corrector advances the phase of the detected m-order harmonic voltage by a reference angle when the m-order harmonic impedance is determined to be capacitive.

12. The control device according to claim 2, wherein the harmonic voltage detector further detects an n-order harmonic voltage (n is an integer different from m and not less than two) included in the voltage, the phase corrector corrects a phase of the detected n-order harmonic voltage in accordance with whether an n-order harmonic impedance when the AC power supply side is seen from the installation point is capacitive or inductive, the command value generator generates a second compensation command value for compensating for the n-order harmonic voltage included in the voltage of the installation point based on the n-order harmonic voltage after the correction, and the output controller controls the output of the active filter based on the first compensation command value and the second compensation command value.

13. The control device according to claim 3, wherein the harmonic voltage detector further detects an n-order harmonic voltage (n is an integer different from m and not less than two) included in the voltage, the phase corrector corrects a phase of the detected n-order harmonic voltage in accordance with whether an n-order harmonic impedance when the AC power supply side is seen from the installation point is capacitive or inductive, the command value generator generates a second compensation command value for compensating for the n-order harmonic voltage included in the voltage of the installation point based on the n-order harmonic voltage after the correction, and the output controller controls the output of the active filter based on the first compensation command value and the second compensation command value.

14. The control device according to claim 4, wherein the harmonic voltage detector further detects an n-order harmonic voltage (n is an integer different from m and not less than two) included in the voltage, the phase corrector corrects a phase of the detected n-order harmonic voltage in accordance with whether an n-order harmonic impedance when the AC power supply side is seen from the installation point is capacitive or inductive, the command value generator generates a second compensation command value for compensating for the n-order harmonic voltage included in the voltage of the installation point based on the n-order harmonic voltage after the correction, and the output controller controls the output of the active filter based on the first compensation command value and the second compensation command value.

15. The control device according to claim 5, wherein
the harmonic voltage detector further detects an n-order harmonic voltage (n is an integer different from m and not less than two) included in the voltage, the phase corrector corrects a phase of the detected n-order harmonic voltage in accordance with whether an n-order harmonic impedance when the AC power supply side is seen from the installation point is capacitive or inductive, the command value generator generates a second compensation command value for compensating for the n-order harmonic voltage included in the voltage of the installation point based on the n-order harmonic voltage after the correction, and the output controller controls the output of the active filter based on the first compensation command value and the second compensation command value.

16. An active filter apparatus comprising:
an active filter connected in parallel with a load at an installation point with respect to an AC power supply provided in a power system; and
a control device for the active filter,
wherein the control device includes
a harmonic voltage detector to detect an m-order harmonic voltage (m is an integer not less than two) included in a voltage of the installation point,
a phase corrector to correct a phase of the detected m-order harmonic voltage in accordance with whether an m-order harmonic impedance when an AC power supply side is seen from the installation point is capacitive or inductive,
a command value generator to generate a first compensation command value for compensating for the m-order harmonic voltage included in the voltage of the installation point based on the m-order harmonic voltage after the correction, and
an output controller to control an output of the active filter based on the first compensation command value,
wherein the phase corrector does not correct the phase of the detected m-order harmonic voltage when the m-order harmonic impedance is inductive.

* * * * *